United States Patent [19]
Chen et al.

[11] Patent Number: 5,824,584
[45] Date of Patent: Oct. 20, 1998

[54] METHOD OF MAKING AND ACCESSING SPLIT GATE MEMORY DEVICE

[75] Inventors: Wei-Ming Chen; Lee Z. Wang; Kuo-Tung Chang; Craig Swift, all of Austin, Tex.

[73] Assignee: Motorola, Inc., Schaumburg, Ill.

[21] Appl. No.: 876,326

[22] Filed: Jun. 16, 1997

[51] Int. Cl.⁶ .............................................. H01L 21/336
[52] U.S. Cl. .................. 438/267; 438/304; 438/563; 438/596; 438/933
[58] Field of Search ................................ 438/258, 266, 438/267, 303, 304, 305, 366, 367, 563, 595, 596, 659, 933; 257/314, 315

[56] References Cited

U.S. PATENT DOCUMENTS

| | | | |
|---|---|---|---|
| 4,837,173 | 6/1989 | Alvis et al. | 438/303 |
| 4,951,100 | 8/1990 | Parrillo | 438/305 |
| 5,013,675 | 5/1991 | Shen et al. | 438/303 |
| 5,063,172 | 11/1991 | Manley | 438/267 |
| 5,408,115 | 4/1995 | Chang | 257/324 |
| 5,422,504 | 6/1995 | Chang et al. | 257/315 |
| 5,467,308 | 11/1995 | Chang et al. | 257/314 |
| 5,470,794 | 11/1995 | Anjum et al. | 438/659 |

OTHER PUBLICATIONS

Hanafi, et al., Fast and Long Retention–Time Nano–Crystal Memory:, IEEE Transactions on Electron Devices, vol. 43, No. 9, pp. 1553–1558, Sep. 1996.

Kikuchi, et al., "Ti Silicidation Technology for High Speed EPROM Devices", IEEE Electron Devices Society, The Japan Society of Applied Physics, 1983 Symposium on VLSI Technology, Digest of Technical Papers, Cat. No. 83, Ch 1873–9, pp. 112–113 no month.

*Primary Examiner*—Charles Bowers
*Assistant Examiner*—Jack Chen
*Attorney, Agent, or Firm*—J. Gustav Larson; Patricia S. Goddard

[57] ABSTRACT

A non-volatile memory having a control gate (14) and a sidewall select gate (28) is illustrated. The sidewall select gate (28) is formed in conjunction with a semiconductor doped oxide (20) to form a non-volatile memory cell (7). The semiconductor element used to dope the oxide layer (20) will generally include silicon or germanium. The non-volatile memory cell (7) is programmed by storing electrons in the doped oxide (20), and is erased using band-to-band tunneling.

14 Claims, 2 Drawing Sheets

METHOD OF MAKING AND ACCESSING SPLIT GATE MEMORY DEVICE

COPENDING APPLICATION

Filed concurrently with the present application is an application entitled "Split Gate Memory Device And Method For Accessing The Same", and having attorney docket number SC90022A.

FIELD OF THE INVENTION

This invention relates in general to non-volatile memory devices, and more particularly to high density, split-gate nonvolatile memory devices capable of operating a low power supply voltages, and to methods for operating and fabricating such devices.

BACKGROUND OF THE INVENTION

State of the art non-volatile memory devices are typically constructed by fabricating a field effect transistor in a silicon substrate. The field effect transistor is capable of storing electrical charge either in a separate gate electrode, known as a floating gate, or in a dielectric layer underlying a control gate electrode. Data is stored in a non-volatile memory device by changing the threshold voltage of the field effect transistor through the storage of electrical charge over the channel region of the substrate. For example, in an n-channel enhancement device, an accumulation of electrons in a floating gate electrode, or in a dielectric layer overlying the channel region, creates a high threshold voltage in the field effect transistor. When the control gate is grounded, current will not flow through the transistor, which is defined as being in a logic zero state. Conversely, a reduction in the negative charge over the channel region creates a low threshold voltage, possibly negative. In this condition, with the control gate grounded, current will flow through the field effect transistor, which is defined as being in a logic one state.

One particular type of non-volatile memory device is the flash EEPROM (electrically-erasable-programmable-read-only-memory). Flash EEPROMs are a type of device which provide electrical erasing capability. The term "flash" refers to the ability to erase the memory cells simultaneously with electrical pulses. In the erased state, the threshold voltage of the field effect transistor is low and electrical current can flow through the transistor indicating a logic 1 state.

To program an EEPROM cell, typically, drain-side hot-electron injection is used to inject electrons onto either a floating gate electrode, or into trapping sites in a dielectric film overlying the channel region. The injection current can be enhanced by increasing either the channel electric field, or the electric field in the dielectric layer. To reduce the amount of time necessary to complete a programming operation, very high drain and gate voltages are used, such that the transistor is operating very close to breakdown during programming. However, the high voltages necessary for drain-side injection require that an additional power supply be provided to supply voltage levels in excess of the standard 5-volt operating voltage.

Breakdown conditions during programming can be avoided by injecting electrons from the source region, rather than the drain region. To program an EEPROM device using source-side injection, a select gate electrode is formed overlying a portion of the channel region adjacent to the source region. The select gate electrode is electrically isolated from the control gate electrode, which is formed adjacent to the drain region. During programming, an electric field gradient is established in the channel region such that electrons originating in the source region are accelerated across a potential drop, and are injected onto a floating gate electrode located below the control gate electrode. Programming with source side injection increases the longevity of an EEPROM device by reducing the stress on the dielectric layer as compared with the excessive electric fields used for drain-side injection. Additionally, it has been demonstrated that source-side injection can be many times more efficient than drain side injection. The higher efficiency reduces the amount of time necessary to perform a programming operation.

Another single gate EEPROM device has been formed by doping gate oxide with germanium, and eliminating the floating gate. By modifying the gate oxide composition of the device, the ability to integrate logic and memory cells on a common substrate becomes infeasible without greatly increasing the manufacturing complexity of the device.

One type of EEPROM device using source side injection requires that three separate semiconductor layers be provided for the fabrication of a select gate, a control gate, and a floating gate. In practice, these three layers are typically formed from three polysilicon layers. Another type of source-side injection EEPROM device uses two polysilicon layers to form a select gate and a sidewall gate which are separated by an oxide-nitride-oxide (ONO) stack. The use of a sidewall gate in a EEPROM device enables one to form higher density memory arrays. Furthermore, fabrication of a sidewall gate device is considered to be simpler than that of a floating gate device due to a fewer number of processing steps. While a sidewall gate device provided improvements in both density and process complexity over floating gate devices, there continues to be a need to simplify the fabrication process by reducing the number of steps. Furthermore, with the integration of flash EEPROM devices with logic on the same integrated circuit there is a need for any simplification in forming the non-volatile memory device to be compatible with the process flow for logic circuitry.

DETAILED DESCRIPTION OF THE DRAWINGS

Generally, the present invention provides a semiconductor device which includes a non-volatile memory, and more particularly a EEPROM, that has improved threshold characteristics and a simpler fabrication flow as compared to prior art devices which include non-volatile memories. More particularly, the present invention utilizes a sidewall gate transistor in conjunction with a semiconductor doped oxide, or dielectric, to form a non-volatile memory cell. The semiconductor element used to dope the oxide will generally include silicon or germanium. Use of the doped oxide layer simplifies the fabrication process by eliminating the need to deposit and etch ONO layers. Deposition and densification of the ONO layers is a time consuming portion of the fabrication process due to the high temperature and long processing times involved. By substituting for this sequence the use of a semiconductor doped oxide, fabrication is greatly simplified. Not only does incorporation of the doped oxide reduce process complexity, but it also provides a performance improvement in the device in the form of lower leakage current. In addition, the present invention allows for implementation of logic and memory cells on a common substrate without increasing the number of processing steps.

These and other features and advantages of the present invention will now be described in further detail from the following detailed description in conjunction with FIGS. 1–7. It is important to point out that the figures are not necessarily drawn to scale, and that there are likely to be other embodiments of the invention which are not specifically illustrated.

Figure 1:
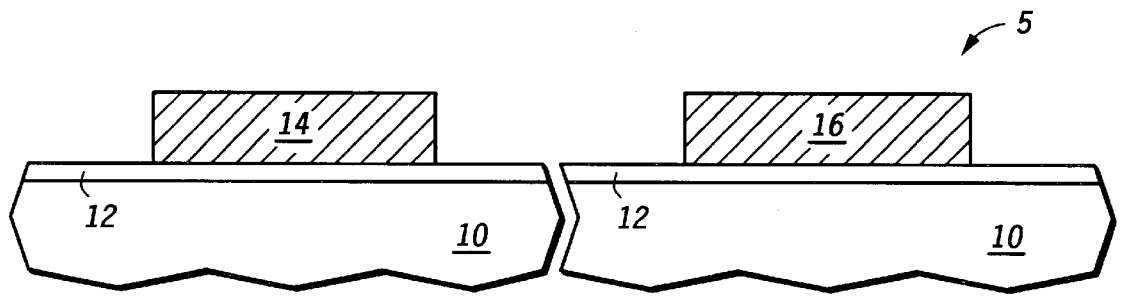
FIGS. 1–6 illustrate, in cross-section, a portion of a semiconductor device which include both a non-volatile memory portion and a logic portion fabricated in accordance with one embodiment of the present invention.

FIGS. 1–6 illustrate in cross-section a portion of a semiconductor device 5 which includes a non-volatile memory portion 7 and a logic portion 9 in accordance with one embodiment of the present invention. As shown in FIG. 1, semiconductor device 5 includes a semiconductor substrate 10 having an overlying dielectric layer 12 and a first gate electrode 14 and a second gate electrode 16. In a preferred embodiment of the invention substrate 10 will be formed of a single crystal semiconductor material such as silicon and dielectric layer 12 will be formed of a dielectric such as silicon dioxide. Also, gate electrodes 14 and 16 are preferably formed of polysilicon. Gate electrode 14 will serve as a select gate for the non-volatile memory device of semiconductor device 5 while gate electrode 16 will serve as a control gate electrode for a transistor to be formed in the logic portion of the device. Dielectric layer 12 serves as the gate oxide for both the non-volatile and logic devices, and preferably is formed to a thickness in the range of 30–300 angstroms, and will generally be approximately 100 angstroms for a low voltage passing transistor and 250 angstroms for high voltage passing transistors.

Figure 2:
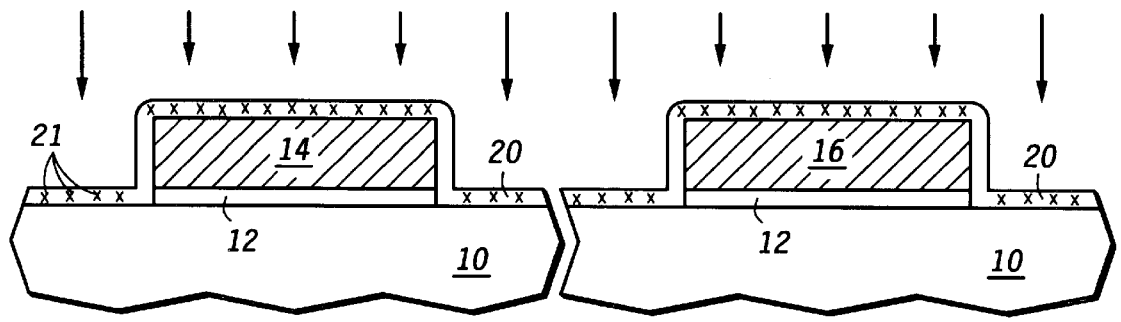

After the gates 14 and 16 have been patterned, an oxide layer 20 is deposited over both portions of the device as illustrated in FIG. 2. Oxide layer 20 is again preferably silicon dioxide thermally grown or chemical vapor deposited to a thickness in the range of 30–500 angstroms, and in general this thickness will be in the low end of this range for low voltage and low power applications.

Following deposition or growth of oxide layer 20, semiconductor device 5 undergoes an implantation step to implant semiconductor atoms 21, such as germanium or silicon, into the oxide layer. The implantation step is a blanket implantation, in that the dopant atoms 21 are introduced across both portions of device 5. The goal in implanting the dopant species in oxide layer 20 is to concentrate a region of dopants into the oxide layer. In a preferred embodiment, the concentration or projected range of dopant atoms 21 will be substantially within the oxide layer such that the greatest concentration will be near approximately the center of the dielectric layer 12. As an example, for an oxide layer which is 240 angstroms thick, implanting germanium dopant atoms into the oxide at a dosage of 1E15 to 1E16 at an energy of 5–10 kev has been found to provide a suitable profile of dopant atoms for purposes of practicing the present invention.

For doping with silicon atoms, it is expected that a lower energy is to be used with roughly the same dosage. While germanium and silicon dopant atoms are used in preferred embodiments of the present invention, it is envisioned that other dopant atoms can be used to achieve the same or similar results. As will be subsequently discussed, the desire is that whatever dopant atoms are used, that they are to be tightly concentrated or consolidated within the center of the oxide layer 12. For example, implantation of the heavy metals such as tungsten or molybdenum may be suitable because the projected standard deviation of implanting these materials is relatively small. Accordingly, the concentration of the dopant atoms can be tightly tailored to be at a specific location inside the oxide. In addition, it is believed that a combination of elements may provide the doping of the oxide layer Following implantation of the dopant atoms, a sidewall gate 28 is formed along the electrode 14 within the non-volatile memory portion of semiconductor device 5. Sidewall gate 28 is separated from the gate electrode 14 by oxide layer 20. To form sidewall gate 28, a blanket layer of polysilicon or other suitable gate material is deposited across both the non-volatile and logic portions of semiconductor device 5. This polysilicon layer is deposited to a thickness no greater than the thickness of gate electrodes 14 and 16, and is deposited at least to a thickness to enable formation of a sidewall spacer using an anisotropic etch technique.

Figure 3:
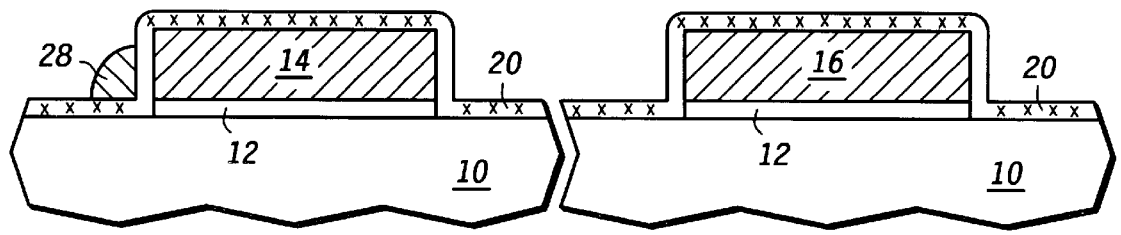

Following deposition of the polysilicon layer which includes sidewall gate 28, semiconductor device 5 is subjected to dry anisotropic etch which results in the formation of polysilicon sidewall spacers formed along each sidewall of both gate electrode 14 and gate electrode 16 within the device 5. After forming the polysilicon sidewall spacers, a mask is formed to protect what will be the source side of the transistor within the non-volatile memory portion 7 of device 5. A mask can be formed using conventional photoresist and photolithography techniques. After formation of such a mask, semiconductor device 5 is again subjected to an etch to remove all polysilicon in the unprotected areas. In other words, to remove the polysilicon sidewall spacers from the drain side of the transistor within the non-volatile memory portion as well as the polysilicon spacers along both sides of the gate electrode in the logic portion of the semiconductor device. The resulting device is illustrated in FIG. 3.

Figure 4:
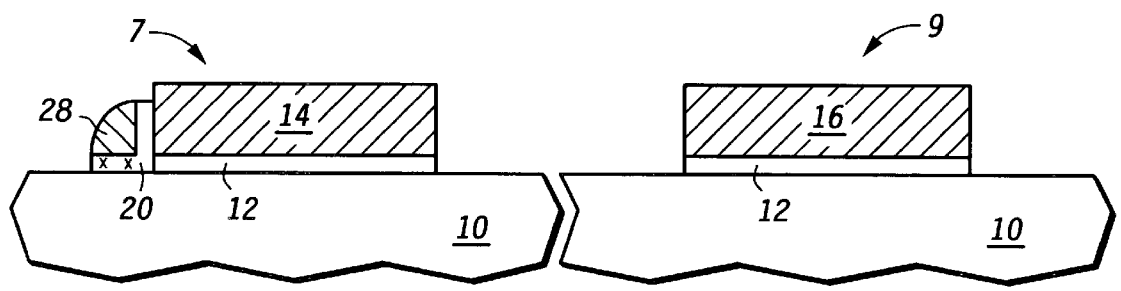

After formation of sidewall gate 28, semiconductor device 5 is subjected to an etch to remove portions of oxide layer 20 as illustrated in FIG. 4. The oxide etch is performed selectively to underlying silicon and polysilicon members, for example by using a dry etch or wet HF (hydrogen fluoride) etch chemistry. The oxide layer is removed in both the non-volatile memory portion 7 and the logic portion of the device, leaving the oxide layer 20 present only between sidewall gate 28 and gate electrode 14 and semiconductor substrate 10. It is noted that a dedicated oxide removal step as represented in going from FIG. 3 to FIG. 4 may not be required in actual practice. For example, in removing the photoresist mask that is used to protect sidewall gate 28 during the polysilicon etch, semiconductor device 5 is likely to undergo one or more cleaning operations. These cleaning operations may adequately remove oxide layer 20 across device 5 such that a separate oxide removal step is not needed.

Figure 5:
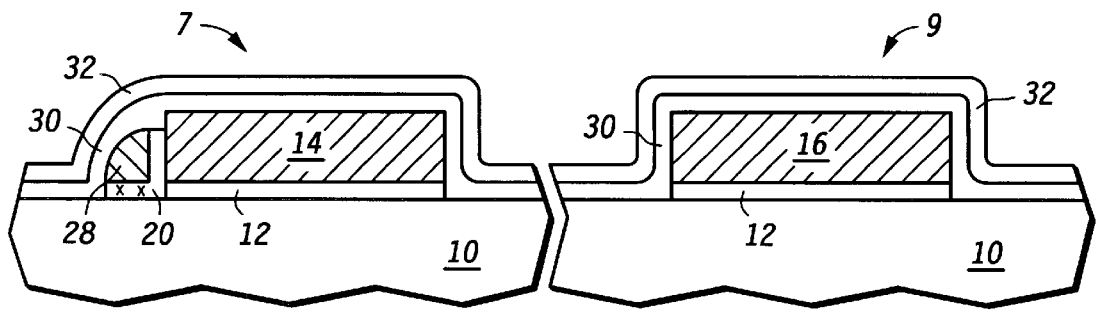

Following removal of oxide layer 20 as shown in FIG. 4, a dielectric layer 30 is deposited over the device to protect sidewall gate 28 from a subsequent silicidation process and to enable formation of a dielectric spacer adjacent to sidewall gate 28 to provide an adequate offset of a self-aligned source region from the sidewall gate electrode (i.e., to provide an effective channel length). In one embodiment, the manner in which this done is illustrated in FIG. 5. An oxide layer 30 is deposited over device 5, followed by deposition of a silicon nitride layer 32. In one embodiment, oxide layer 30 is deposited using tetraethylorthosilicate (TEOS) and is deposited to a thickness of between 100–200 angstroms. Silicon nitride layer 32 is preferably deposited by CVD to a thickness of between 500 and 3,000 angstroms. In this particular embodiment, the purpose of oxide layer 30 is to enable sidewall spacers to be formed from silicon nitride layer 32, without attacking the underlying silicon substrate during the spacer etch. In other words, oxide layer 30 serves as an etch stop. In another embodiment of the present invention, oxide layer is not necessary, if there is a sufficient thickness of oxide or another etch stop material subsequently formed on exposed portions of semiconductor device 10 to provide an adequate etch stop during the spacer etch.

In addition, one skilled in the art would appreciate that the first and second gates are contacted in a conventional manner.

Figure 6:
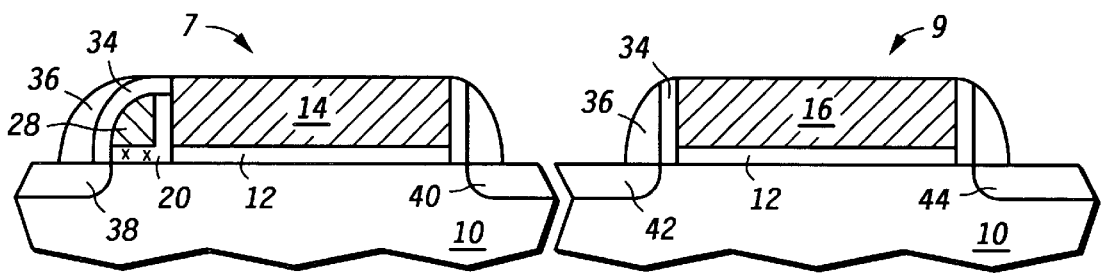

As shown in FIG. 6, and as alluded to above, semiconductor device 5 is subjected to an anisotropic etch to form nitride sidewall spacers 36 along both sidewalls of both gate electrode 14 and gate electrode 16. Following formation of nitride spacers 36, convention ion implantation is used to form a source region 38 and a drain region 40 in the non-volatile portion 7 of device 5, while simultaneously forming a source region 42 and a drain region 44 for the transistor and the logic portion of semiconductor device 5. The presence of nitride spacers 36 enable the source and drain regions to be formed in a self-aligned manner. It should be noted, that a nitride spacer would not be needed, if the width of the sidewall gate is sufficiently large to create an effective channel length for operating the transistor. Generally, the advantage of using the sidewall spacer is that improved density can be obtained.

Once it is assured that there is appropriate spacing to form a channel, an annealing step needs to occur. The step of annealing allows the formation of a locally concentrated area of the implanted species where charges can be trapped and stored. The locally concentrated area of the implanted species will generally have a greater concentration than prior to the annealing step. The step of annealing can be performed independently, but in a preferred embodiment is the result of subsequent source and drain activation anneal step. The formation of the dopant concentrated area allows for charge to be stored which will effect the Vt of the sidewall transistor, allowing it to operation in a non-volatile manner. In one embodiment, it is believed that microcrystals of the semiconductor element are formed.

Figure 7:
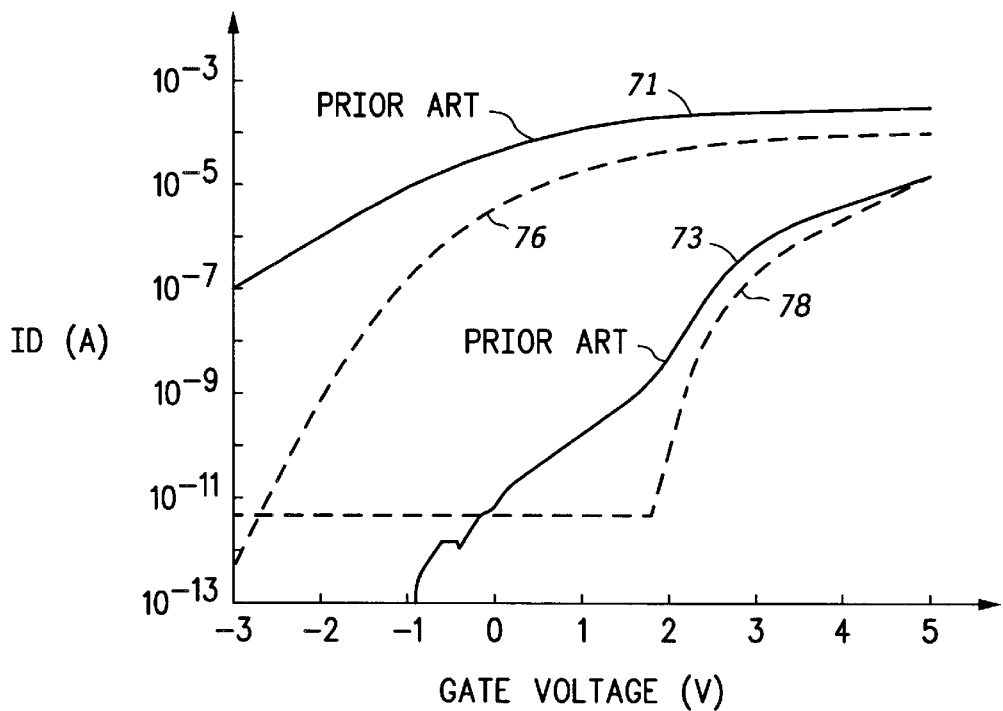
FIG. 7 illustrates current versus voltage (I-V) curves of a sidewall gate transistor having a germanium doped oxide in accordance with the present invention as compared to a sidewall gate transistor having an ONO as in the prior art.

FIG. 7 illustrates I-V characteristics of the present invention, as compared to the prior art. Lines 71 and 76 represent an erased sidewall transistor using the prior art and the present invention respectively. As illustrated, the present invention provides an improved subthreshold slope as compared to the prior art. As a result, the present invention permits lower leakage current and improved rise times associated with a completed device. Curves 73 and 78 represent an programmed sidewall transistor using the prior art and the present invention respectively. Similar to the preceding discussion, the curve 78 illustrates that the present invention provides a better subthreshold slope than the prior art. The advantages originate from the fact that thicker thermally grown oxide is used and no CVD oxide and nitride is used as in the prior art.

To electrically program non-volatile cell memory that includes gates 14 and 20, a programming drain voltage such as, for example, a ground voltage is applied to drain region 40. A programming select gate voltage that is higher than the programming drain voltage by at least a threshold voltage of the portion of the channel region under select gate 14 is applied to select gate 14. A programming source voltage that is higher than the programming drain voltage is applied to source region 38. Further, a programming control gate voltage that is higher than the programming source voltage is applied to control gate 28. By way of example, the programming select gate voltage is between approximately one volt and approximately two volts, the programming source voltage is between approximately three volts and approximately six volts, and the programming control gate voltage is between approximately eight volts and approximately ten volts.

Because source region 38 is at a higher voltage level than drain region 40, n-channel FET including gates 14 and 28 operates in a reverse active mode. In other words, source region 38 functions as a drain of the FET of FIG. 6, and drain region 40 functions as a source of during the programming process. Further, select gate 14 is at a voltage level higher than the voltage level of drain region 40 by at least a threshold voltage of the portion of channel region under select gate 14. Thus the portion of channel region under select gate 14 is switched on and conductive. Negative charge carriers, e.g., electrons, originate from drain region 40 and are accelerated through the portion of channel region between select gate 14 and control gate 28. When they reach the portion the channel region adjacent source region 38 and under control gate 28, the charge carriers are attracted by the high voltage at control gate 28. In a hot carrier injection process, the charge carriers are injected across the doped oxide layer 20 and trapped in the dopant concentrated area formed during the steps described previously. As the negative charge carriers, e.g., electrons, move from channel region into the dopant concentrated area of the doped oxide layer 20, a threshold voltage of the portion of channel region under control gate 28 increases. Thus, the current flowing through channel region decreases and so does the rate of hot carrier injection. After the programming voltages are removed from the non-volatile memory (NVM), the injected carriers remain trapped in the dopant concentrated area of the doped oxide layer 20. A first logic value, e.g., a logic one, is stored in the NVM cell, i.e., the NVM cell is programmed.

During the programming process, current flowing in the channel region under the select gate 14 is limited by the programming select gate voltage level applied to select gate 14. Preferably, the programming select gate voltage is slightly above the threshold voltage of the portion of channel region under select gate 16, thereby allowing a small current flowing in channel region 38. Thus, process of programming The NVM cell is power efficient and suitable for low voltage and low power applications.

To electrically erase The NVM cell, an erasing source voltage is applied to source region 38, and an erasing control gate voltage that is lower than the erasing source voltage is applied to control gate 28. By way of example, the erasing source voltage is between approximately five volts and approximately seven volts, and the erasing control gate voltage is between approximately −8 volts and approximately −9 volts. In one embodiment of the present invention, the select gate and drain regions do not participate in the erasing process, and they can be either coupled to a reference voltage level, e.g., ground voltage level, or floating. In a preferred embodiment of erasing the NVM cell, an erasing drain voltage of approximately 1.8 volts is applied to the drain 40. This drain voltage embodiment of the present invention has been demonstrated to increase the life expectancy of a device by more than an order of magnitude.

Because of a high voltage difference between source region 38 and control gate 28, e.g., ranging from approximately thirteen volts to approximately seventeen volts, a strong electric field is established in the overlap portion of source region under control gate 28. Through a band to band tunneling process, the strong electric field generates electron-hole pairs in the overall region of source 38 and control gate 28. The holes, which are positive charge carriers, gain energy through the electric field at the source edge and are attracted by the negative voltage at control gate 28. This varies from the prior art which uses a hot carrier injection process, where the holes are injected across an oxide layer into silicon nitride layer 24 of ONO stack 25, where they combine with the electrons in silicon nitride layer 24. Preferably, the erasing process continues until the oxide layer 20 become substantially electrically neutral or positively charged. After the erasing voltages are removed from the NVM cell, the doped oxide layer 20 remains substantially neutral or positively charged. In either case, a second logic value, e.g., a logic zero, is stored in NVM cell, i.e., The NVM cell is erased.

During the erasing process, the charges stored in the dopant concentrated area in layer 20 are neutralized by charges of opposite polarity injected from channel region 38. This differs from the erasing process of the prior art, in which the charge stored in the charge trapping sites move to a control gate in a Fowler-Nordheim tunneling process through a dielectric layer between the charge trapping sites and the control gate.

To read data from the NVM cell, a reading source voltage such as, for example, ground voltage is applied to source region 38. A reading control gate voltage that is substantially equal to or higher than the reading source voltage is applied to control gate 28. A reading select gate voltage that is higher than the reading source voltage by at least a threshold voltage of the portion of channel region under select gate 14 is applied to select gate 16. Thus, the portion of channel region under select gate 14 is switched on and conductive. A reading drain voltage that is higher than the reading source voltage is applied to drain region 40. By way of example, the reading control gate voltage is between approximately one volt and approximately two volts, the reading drain voltage is between approximately one volts and approximately two volt, and select gate 16 is coupled to a supply voltage, $V_{DD}$. By way of example, the supply voltage $V_{DD}$ ranges between approximately three volts and approximately five volts. In low power applications, the supply voltage $V_{DD}$ usually ranges between, for example, approximately 0.9 volt and approximately 1.8 volts.

If the NVM cell has been programmed, doped oxide layer 20 will contain electrons within the dopant concentrated area. Therefore, the portion of channel region under control gate 28 has a threshold voltage that is higher than its intrinsic threshold voltage when silicon nitride layer 24 are substantially neutral. If the NVM cell has been erased, the doped region 20 is substantially neutral or positively charged. The portion of channel region under control gate 28 has a threshold voltage that is substantially equal to or lower than its intrinsic threshold voltage. The reading control gate voltage is preferably lower than the threshold voltage of the portion of channel region under control gate 28 if the NVM cell has been programmed. In addition, the reading control gate voltage is preferably higher than the threshold voltage of the portion of channel region under control gate 28 if The NVM cell has been erased. Therefore, when reading data from a programmed The NVM cell, channel region is nonconductive and the current flowing therethrough is small, e.g., equal to or less than approximately 2 microamperes ($\mu$A). A sense amplifier (not shown) coupled to drain region 40 via a bit line (not shown in FIG. 1) senses the small current and reads the first logic value, e.g., logic one, from The NVM cell. On the other hand, when reading data from an erased The NVM cell, channel region is conductive and the current flowing therethrough is large, e.g., equal to or greater than approximately 10 $\mu$A. The sense amplifier (not shown) coupled to drain region 40 senses the large current and reads the second logic value, logic zero, from The NVM cell.

During the reading process, source region 38 is at a lower voltage level than drain region 40. The voltage drop across the portion of channel region under control gate 28 is small. Thus, the probability of charge carriers being inadvertently injected from channel region into the oxide layer 20 is small. In other words, the disturbance to the data stored in The NVM cell during the reading process is small. In accordance with the present invention, the sense amplifier (not shown) is coupled to drain region 40 via a bit line (not shown in FIG. 1) and drain region 40 is separated from silicon nitride layer 24 by select gate 14. Therefore, the capacitance of a parasitic bit line capacitor is substantially independent of the charges in silicon nitride layer 24. In other words, the data dependence of the parasitic bit line capacitance is small in The NVM cell. An NVM cell, such as The NVM cell, having a small data dependence of the bit line capacitance is suitable for high performance applications.

In the foregoing specification, the invention has been described with reference to specific embodiments. However, one of ordinary skill in the art appreciates that various modifications and changes can be made without departing from the scope of the present invention as set forth in the claims below. For example, the programming voltages may be shifted relative to a common voltage and maintain a similar function. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A method of forming a split gate transistor structure comprising the steps of:

providing a substrate;

forming a first dielectric region over the substrate;

forming a first conductive region over the first dielectric region to form a first gate;

forming an oxide layer over the substrate following the step of forming a first conductive region;

doping the oxide layer with a semiconductor dopant, to form a doped layer; and forming a conductive second gate adjacent to the first gate, wherein the conductive second gate is a conductive sidewall gate.

2. The method of claim 1, wherein the step of forming the doped layer includes the semiconductor dopant being germanium.

3. The method of claim 1, wherein the step of forming the doped layer includes the semiconductor dopant being silicon.

4. The method of claim 1, wherein the step of forming the doped layer includes the substep of:

exposing the oxide layer to an ion beam containing the semiconductor dopant, such that a projected range of the semiconductor dopant is substantially within the oxide layer.

5. The method of claim 4, wherein:

the step of forming a doped layer further comprises the doped layer having a first semiconductor concentration at a projected range; and the method further comprising the step of annealing the doped layer to form an annealed doped layer, the annealed doped layer having a second semiconductor concentration at the projected range, wherein the second semiconductor concentration is more concentrated than the first semiconductor concentration.

6. The method of claim 5, wherein the step of annealing includes:

forming at least a portion of the annealed doped layer during a subsequent step of:
annealing to activate a source-drain region associated with the first gate.

7. The method of claim 1, wherein the step of forming the doped layer includes selectively forming a doped layer adjacent to the first gate.

8. The method of claim 7, wherein the step of forming the doped layer further includes using a mask for selectively forming the doped layer.

9. The method of claim 1 further comprising the step of:
etching the doped layer to remove a portion of the doped layer that is adjacent to the conductive sidewall gate.

10. The method of claim 9, wherein the step of etching the doped layer removes substantially all of the doped layer that is adjacent to the conductive sidewall gate.

11. The method of claim 9 further comprising the step of:
forming a second dielectric layer over the substrate following the step of forming the conductive second gate.

12. The method of claim 11 further comprising the step of:
etching the second dielectric layer to form a spacer adjacent to the first gate.

13. The method of claim 12 further comprising the step of:
forming a first current region adjacent to a first side of the first gate, and a second current region adjacent to a second side of the first gate.

14. The method of claim 13 further comprising the step of:
forming contacts to the first current region and the second current region; and providing local interconnect to the contacts.

* * * * *